(12) United States Patent
Herrmann et al.

(10) Patent No.: US 9,076,941 B2
(45) Date of Patent: Jul. 7, 2015

(54) METHOD OF PRODUCING AT LEAST ONE OPTOELECTRONIC SEMICONDUCTOR CHIP

(75) Inventors: Siegfried Herrmann, Neukirchen (DE); Stefan Illek, Donaustauf (DE)

(73) Assignee: OSRAM Opto Semiconductors GmbH (DE)

( * ) Notice: Subject to any disclaimer, the term of this patent is extended or adjusted under 35 U.S.C. 154(b) by 43 days.

(21) Appl. No.: 14/004,442

(22) PCT Filed: Mar. 12, 2012

(86) PCT No.: PCT/EP2012/054270
§ 371 (c)(1),
(2), (4) Date: Nov. 4, 2013

(87) PCT Pub. No.: WO2012/123410
PCT Pub. Date: Sep. 20, 2012

(65) Prior Publication Data
US 2014/0051194 A1    Feb. 20, 2014

(30) Foreign Application Priority Data

Mar. 14, 2011 (DE) .......................... 10 2011 013 821

(51) Int. Cl.
*H01L 33/60* (2010.01)
*H01L 33/62* (2010.01)
(Continued)

(52) U.S. Cl.
CPC .............. *H01L 33/60* (2013.01); *H01L 33/007* (2013.01); *H01L 33/0079* (2013.01);
(Continued)

(58) Field of Classification Search
CPC ......... H01L 33/44; H01L 33/46; H01L 33/58; H01L 33/60; H01L 33/62; H01L 2924/12041

USPC ......... 438/25–26, 29, 38, 57, 64, 69, 72, 458, 438/464
See application file for complete search history.

(56) References Cited

U.S. PATENT DOCUMENTS 7,029,943 B2 * 4/2006 Kruhler ........................... 438/57
2005/0104179 A1 5/2005 Zilber et al.
(Continued)

FOREIGN PATENT DOCUMENTS

| JP | 2007-517404 | 6/2007 |
| JP | 2010-199513 | 9/2010 |

(Continued)

OTHER PUBLICATIONS

English translation of a Japanese Examination Report dated Oct. 7, 2014 for Japanese Application No. 2013-558392.

*Primary Examiner* — Thanhha Pham
(74) *Attorney, Agent, or Firm* — DLA Piper LLP (US)

(57) ABSTRACT

A method of producing at least one optoelectronic semiconductor chip includes providing at least one optoelectronic structure, including a growth support and a semiconductor layer sequence with an active region, the semiconductor layer sequence being deposited epitaxially on the growth support, providing a carrier, applying the at least one optoelectronic structure onto the carrier with its side remote from the growth support, coating the at least one optoelectronic structure with a protective material, the protective material covering the outer face, remote from the carrier, of the growth support and side faces of the growth support and of the semiconductor layer sequence, and detaching the growth support from the semiconductor layer sequence of the at least one optoelectronic structure.

11 Claims, 4 Drawing Sheets

(51) Int. Cl.
  *H01L 33/58* (2010.01)
  *H01L 33/44* (2010.01)
  *H01L 23/00* (2006.01)
  *H01L 33/00* (2010.01)
  *H01L 33/22* (2010.01)
  *H01L 33/38* (2010.01)
  *H01L 33/46* (2010.01)
  *H01S 5/02* (2006.01)
  *H01S 5/022* (2006.01)
  *H01S 5/323* (2006.01)

(52) U.S. Cl.
  CPC ............... *H01L 33/22* (2013.01); *H01L 33/382* (2013.01); *H01L 33/44* (2013.01); *H01L 33/46* (2013.01); *H01S 5/0201* (2013.01); *H01S 5/0217* (2013.01); *H01S 5/0224* (2013.01); *H01S 5/32341* (2013.01); *H01L 24/19* (2013.01); *H01L 2924/12041* (2013.01)

(56) References Cited

U.S. PATENT DOCUMENTS

| | | |
|---|---|---|
| 2006/0091409 A1 | 5/2006 | Epler et al. |
| 2009/0014747 A1 | 1/2009 | Shiue et al. |
| 2010/0038669 A1 | 2/2010 | McKenzie |
| 2010/0163887 A1 | 7/2010 | Kim et al. |
| 2010/0213494 A1 | 8/2010 | Lee |
| 2011/0031513 A1 | 2/2011 | Hsieh et al. |

FOREIGN PATENT DOCUMENTS

| | | |
|---|---|---|
| WO | 02/33760 A1 | 4/2002 |
| WO | 2010/054628 A2 | 5/2010 |
| WO | 2011/007275 A1 | 1/2011 |
| WO | 2011/016201 A1 | 2/2011 |

\* cited by examiner

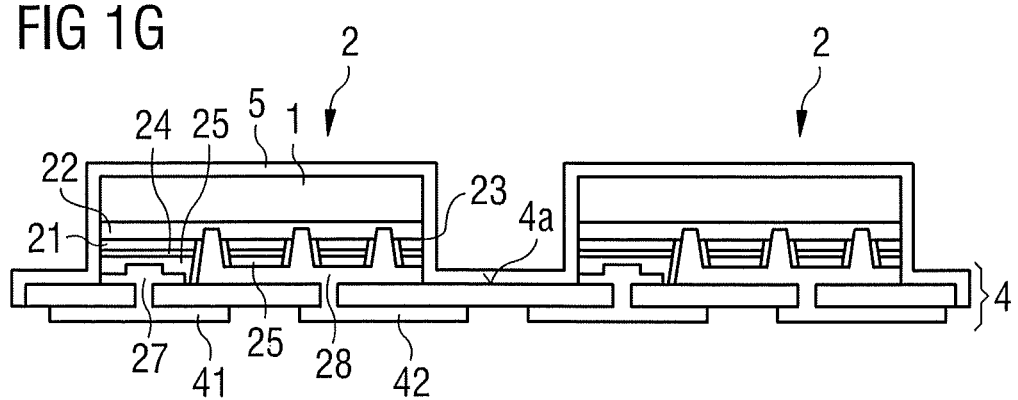
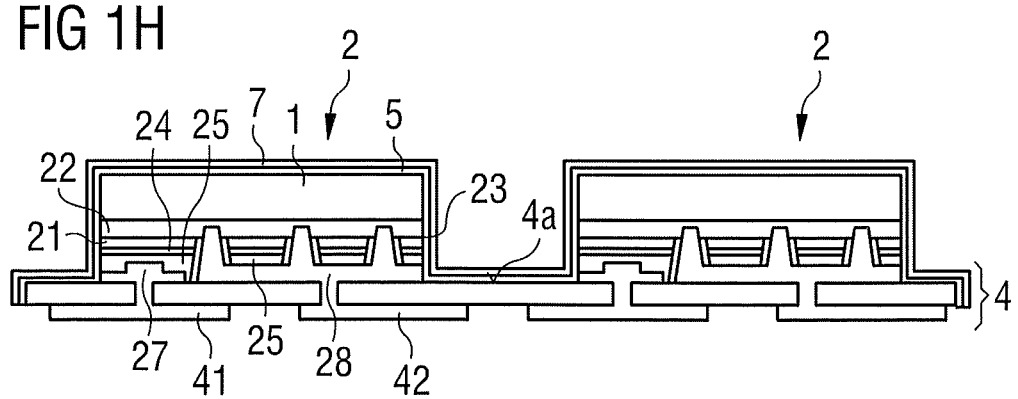
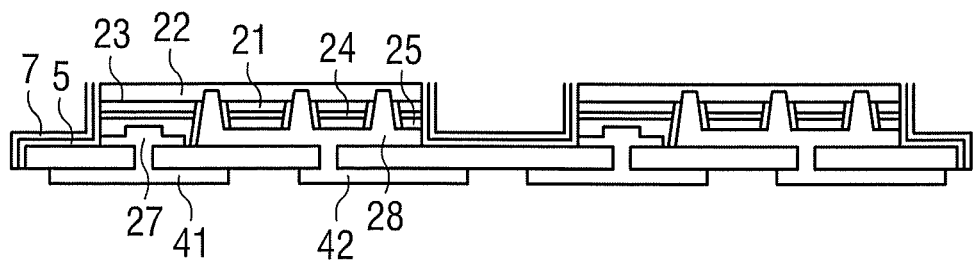

METHOD OF PRODUCING AT LEAST ONE OPTOELECTRONIC SEMICONDUCTOR CHIP

TECHNICAL FIELD

This disclosure relates to a method of producing at least one optoelectronic semiconductor chip.

BACKGROUND

WO 02/33760 A1 describes a method of producing so-called thin-film light-emitting diode chips in which a growth substrate is separated from optoelectronic structures present in the wafer composite. Prior to detachment of the growth substrate, the optoelectronic structures are jointly fastened to a carrier with their side remote from the growth substrate.

It could nonetheless be helpful to provide a method of producing at least one optoelectronic semiconductor chip in which the risk of damage to semiconductor chips during production is reduced.

SUMMARY

We provide a method of producing at least one optoelectronic semiconductor chip including providing at least one optoelectronic structure, including a growth support and a semiconductor layer sequence with an active region, the semiconductor layer sequence being deposited epitaxially on the growth support, providing a carrier, applying the at least one optoelectronic structure onto the carrier with its side remote from the growth support, coating the at least one optoelectronic structure with a protective material, the protective material covering the outer face, remote from the carrier, of the growth support and side faces of the growth support and of the semiconductor layer sequence, and detaching the growth support from the semiconductor layer sequence of the at least one optoelectronic structure.

BRIEF DESCRIPTION OF THE DRAWINGS

FIGS. 1A, 1B, 1C, 1D, 1E, 1F, 1G, 1H and 1I show schematic sectional representations of different method steps of an example of our method.

DETAILED DESCRIPTION

Figure 1A:
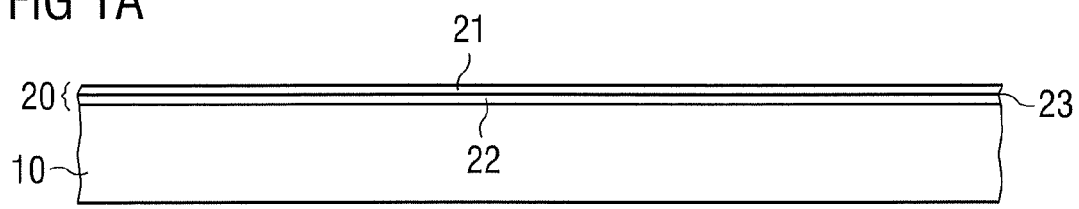

Our method may comprise a method step in which at least one optoelectronic structure is provided. The optoelectronic structure may comprise in particular a growth support and a semiconductor layer sequence deposited epitaxially on the growth support. The optoelectronic structure further may comprise at least one active region provided for emission or detection of electromagnetic radiation when the subsequent optoelectronic semiconductor chip is in operation. The optoelectronic semiconductor chip may then, for example, be a light-emitting diode chip, a laser diode chip or a photodiode chip.

The growth support is the sub-region of a growth substrate which, together with the semiconductor layer sequence, is separated from a wafer assembly comprising growth substrate and epitaxially deposited semiconductor layer sequence. This means that the optoelectronic structures comprise elements already singulated from the growth wafer, the growth support still being connected to the semiconductor layer sequence. In the method it is possible, in particular, for a plurality of such optoelectronic structures to be provided.

A carrier may be provided in a further method step. The carrier is the subsequently mechanically load-bearing element of the optoelectronic semiconductor chip. The carrier may, for example, be a connection carrier to which the optoelectronic structures may be mechanically fastened and electrically conductively connected in a subsequent method step. The carrier then comprises, for example, a base body of an electrically insulating material such as, for example, undoped silicon or a ceramic material such as aluminium nitride or aluminium oxide, on which and/or in which conductor tracks and/or contact points are provided for electrical contact and connection of optoelectronic structures.

In a further method step the at least one optoelectronic structure may be applied onto the carrier with its side remote from the growth support. The optoelectronic structure may here be connected mechanically firmly and electrically conductively with the carrier. It is possible, in particular, for a plurality of optoelectronic structures to be applied to the carrier. It is, however, also possible for a plurality of carriers to be provided, wherein one or more optoelectronic structures are applied to each carrier. If a plurality of optoelectronic structures is applied to a carrier, it is possible in a subsequent method step for the carrier together with the optoelectronic structures to be divided into individual optoelectronic semiconductor chips, each carrier part then bearing at least one optoelectronic structure. The at least one optoelectronic structure is applied onto the carrier, for example, by soldering.

In a further method step the at least one optoelectronic structure may be coated with a protective material, the protective material covering the outer face, remote from the carrier, of the growth support and side faces of the growth support and of the semiconductor layer sequence. The protective material may be applied in a layer of uniform thickness. The thickness of the layer preferably amounts to at least 0.5 μm and/or at most 2 μm. The protective material is configured, for example, to be transmissive to electromagnetic radiation, in particular transparent and/or electrically insulating. The protective material may be applied by vaporization, sputtering, a CVD method, an ALD (Atomic Layer Deposition) method or by spin-coating. At the points where it covers the optoelectronic structure, the protective material is preferably in direct contact with the outer face of the optoelectronic structure. The protective material is present in particular in the region of the side face of the semiconductor layer sequence where, for example, the active region would be laterally exposed.

In a further method step the growth support may be detached from the semiconductor layer sequence of the at least one optoelectronic structure, i.e., the growth support is removed from the semiconductor layer sequence such that, of the optoelectronic structure, the semiconductor layer sequence remains and is exposed at its side remote from the carrier. The growth support is then, for example, removed completely from the semiconductor layer sequence such that no residues of the growth support remain on the semiconductor layer sequence. Since the outer face of the growth support is covered at least in places by the protective material, the protective material is also partially removed on detachment of the growth support. The protective material remains however, at least temporarily, on the side faces of the semiconductor layer sequence and covers the latter even after detachment of the growth support.

The method of producing at least one optoelectronic semiconductor chip may comprise the following steps:
- providing at least one optoelectronic structure comprising a growth support and a semiconductor layer sequence with an active region, the semiconductor layer sequence being deposited epitaxially onto the growth support,
- providing a carrier,
- applying the at least one optoelectronic structure onto the carrier with its side remote from the growth support,
- coating the at least one optoelectronic structure with a protective material, the protective material covering the outer face, remote from the carrier, of the growth support and side faces of the growth support and of the semiconductor layer sequence, and
- detaching the growth support from the semiconductor layer sequence of the at least one optoelectronic structure.

Underlying the method described here is, inter alia, the recognition that application of a protective material in particular to side faces of the semiconductor layer sequence can protect the semiconductor layer sequence from damage during detachment of the growth support. This may increase optoelectronic semiconductor chip yield. In addition to the semiconductor layer sequence, other components of the optoelectronic structure such as any mirror layers and/or contact layers present, may also be protected from damage by the protective material during detachment of the growth support.

After coating the at least one optoelectronic structure, the protective material may completely cover the outer face, not covered by the carrier, of the at least one optoelectronic structure and, at least in places, the top face of the carrier facing the at least one optoelectronic structure. This means that the protective material is laid over the entire outer face, not covered by the carrier, of the optoelectronic structure such that exposed side faces of the semiconductor layer sequence and of the growth support as well as the outer face of the growth support remote from the carrier are completely covered by the protective material.

The protective material is here applied in particular on the side face of the optoelectronic structure, which connects the outer face of the growth support with the carrier, in particular also in the region between carrier and optoelectronic structure such that the optoelectronic structure is completely encapsulated in the protective material and the carrier after coating. The protective material envelops the optoelectronic structure preferably in form-fitting manner.

The protective material, for example, provides protection against liquid penetrating in particular into regions between the carrier and the optoelectronic structure. It is also possible for the entire top face of the carrier, facing the optoelectronic structures, to be completely covered with the protective material in places where no optoelectronic structure is situated.

The remaining protective material may be removed after detachment of the growth support from the semiconductor layer sequence of the at least one optoelectronic structure. The protective material is then not a permanent protective film but rather a temporary protective film removed again after the detachment process, i.e., in this example the protective material does not perform any further functions in the subsequent optoelectronic semiconductor chip. In this case a protective material may advantageously be selected which is optimized with regard to its protective action during detachment. It is then possible, for example, for the protective material to be radiation-opaque since it does not have to fulfil any optical tasks in the subsequent procedure.

The outer face of the protective material remote from the at least one optoelectronic structure may be coated with a reflective material at least in places prior to detachment of the growth support. It is possible, in this case, for the entire outer face to be coated with the reflective material. The reflective material is applied to the protective material in particular when the latter remains in the subsequent semiconductor chip, i.e., is not removed after detachment. The reflective material may, for example, comprise a metal layer or a metal layer sequence. It is moreover possible for the reflective material to be electrically insulating material. For example, a layer with particles of titanium dioxide, which is diffusely reflective, may be applied onto the outer face. After application of the reflective material, the outer face may then, for example, appear white to the observer.

The reflective material is provided in particular to reflect electromagnetic radiation as generated or detected in the active region of the optoelectronic semiconductor chip.

The reflective material may completely cover the exposed outer face of the protective material. During detachment of the carrier, the reflective material may perform a further protective function and supplement the protective action of the protective material.

The growth support may be detached using an etchant and the protective material is not susceptible to attack by the etchant or is not attacked by the etchant during the etching process, i.e., the protective material may, for example, be chemically inert relative to the etchant.

The protective material is formed with a radiation-transmissive plastics material, for example, and may consist thereof. An organic polymer as is described, for example, in WO 2010/054628, is particularly suitable as the protective material. The subject matter of WO 2010/054628 in particular with regard to the organic polymer described therein is incorporated herein by reference.

A particularly suitable protective material may here comprise a Parylene or consist of a Parylene. In particular, such a protective material may also remain in the optoelectronic semiconductor chip since it may be configured, for example, to be transmissive, in particular transparent, to the electromagnetic radiation to be generated or detected in the active region.

Where an etchant is used to detach the growth support, the method described here is particularly suitable when a material is used as the growth substrate which cannot be detached from the epitaxially deposited semiconductor layer sequence by detachment methods such as, for example, a laser separation process. The method is, for example, particularly well suited to a growth support comprising silicon or consisting of silicon. The protective material prevents the chemicals used to detach the growth support from being able to attack components of the optoelectronic structure.

The growth support may comprise silicon and the semiconductor layer sequence is based on a III-V compound semiconductor material, in particular on a nitride compound semiconductor material such as GaN, for example.

The at least one optoelectronic structure may comprise n-side and p-side contact points on its side facing the carrier, the contact points being connected electrically conductively with the carrier on application of the at least one optoelectronic structure onto the carrier. This means that there is no electrical connection point of the optoelectronic structure on the outer face, remote from the carrier, of the optoelectronic structure, this being the semiconductor layer sequence after detachment of the growth support. Instead, contacting, for example, of the n-side of the semiconductor layer sequence proceeds through the p-side and the active region. Current distribution then in particular does not take place at the radiation exit face or radiation entrance face of the optoelectronic semiconductor chip such that no absorption of electromagnetic radiation can occur at current distribution structures of the optoelectronic semiconductor chip. It is in particular also possible with such an optoelectronic structure to create an optoelectronic component free of connecting wires. The optoelectronic semiconductor chip produced by the method may, for example, be surface-mountable, i.e., the electrical connection points of the semiconductor chip may be located at the outer face of the carrier remote from the optoelectronic structure.

With the method described here, it is moreover in particular possible for division of the semiconductor layer sequence deposited epitaxially onto a growth substrate into individual optoelectronic structures which are subsequently associated, for example, with individual optoelectronic semiconductor chips to proceed as early as before detachment of the growth support. This means that, on singulation into individual optoelectronic semiconductor chips after detachment of the growth support, singulation does not have to proceed through the active region.

The methods described here are explained in greater detail below with reference to examples and the associated figures.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

In conjunction with FIG. 1A, a method step of a method described here is explained in greater detail, in which a semiconductor layer sequence 20 is deposited epitaxially onto a growth substrate 10. The growth substrate 10 is, for example, a silicon wafer and contains or consists of silicon. The semiconductor layer sequence 20 is based, for example, on a nitride compound semiconductor material such as GaN. The semiconductor layer sequence 20 comprises a p-conductive layer 21, an n-conductive layer 22 and an active region 23, which is arranged between the p-side 21 and the n-side 22.

Figure 1B:
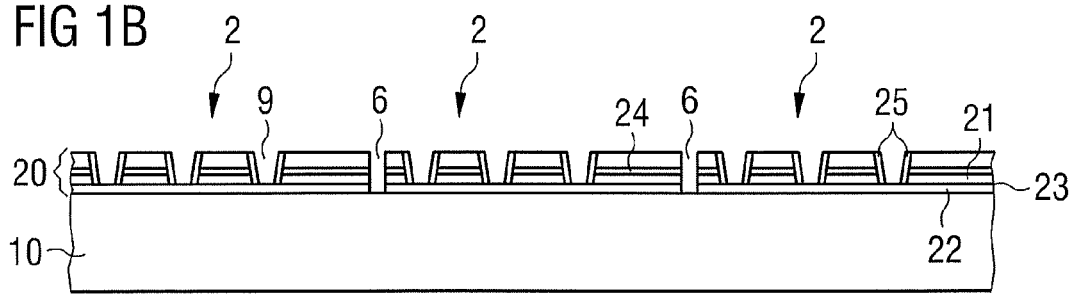

In a next method step, FIG. 1B, the semiconductor layer sequence is subdivided into individual optoelectronic structures 2 which may subsequently be associated, for example, with individual semiconductor chips. In the process, in addition to the separating trenches 6 between individual optoelectronic structures, vias 9 are also prepared in the individual optoelectronic structures 2, which vias penetrate the p-side 21 and the active region 23 of each optoelectronic structure and extend as far as the n-side 22.

In addition, one or more passivation layers 25 are applied. These may, for example, contain silicon dioxide and/or silicon nitride or consist of one of these materials.

Figure 1C:
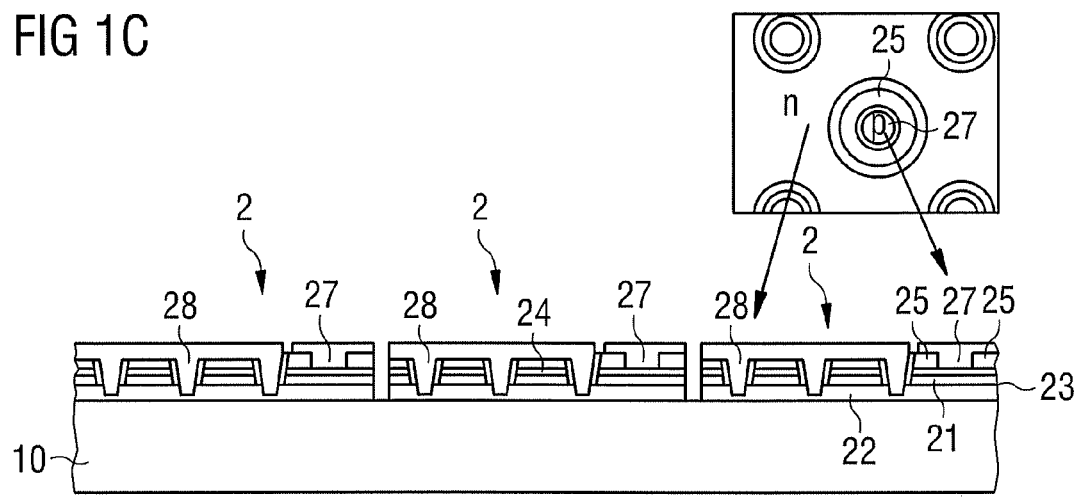

A method step is described in conjunction with FIG. 1C in which electrically conductive material, for example, a metal is applied onto the individual structures 2 to form the p-side contact points 27 and the n-side contact points 28. The n-side contact points 28 extend, for example, through the vias 9 from the side of the semiconductor layer sequence remote from the growth substrate 10 as far as into the n-side 22. As shown in FIG. 1C, the n-side contact point 28 may here surround the p-side contact point 27, which is separated from the n-side contact point 28 by the annularly configured passivation layer 25.

Figure 1D:
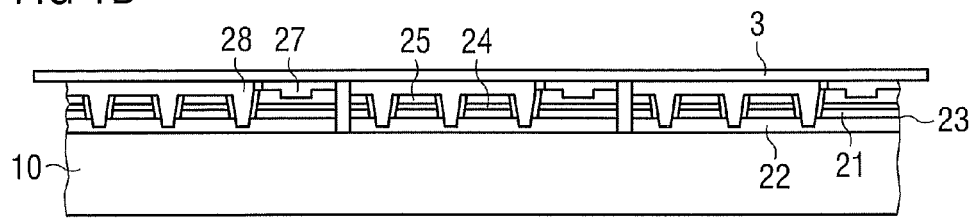

In a next method step, FIG. 1D, the assembly produced in this way is applied, e.g., adhesively bonded, with its side remote from the growth substrate 10 onto an auxiliary carrier. The auxiliary carrier may be formed with a film, for example.

In addition, the growth substrate 10 may be thinned, this possibly proceeding, for example, by grinding and/or etching.

Figure 1E:
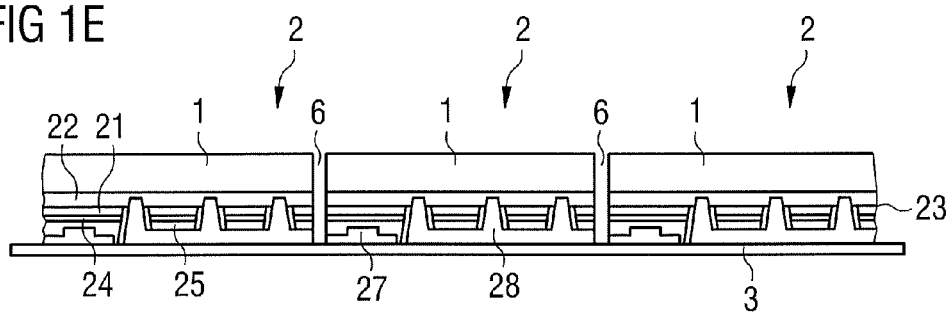

In a next method step, as described in conjunction with FIG. 1E, the growth substrate 10 is divided along the separating trenches 6, resulting in individual optoelectronic structures 2, each optoelectronic structure 2 comprising a growth support 1, which originates from the prior growth substrate.

Figure 1F:
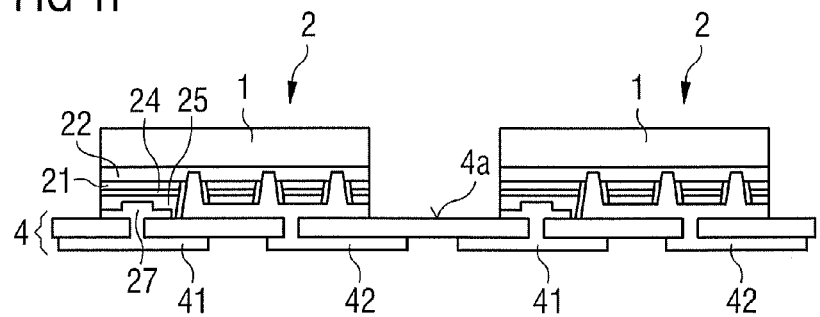

In the method step described in conjunction with FIG. 1F, the individual optoelectronic structures 2 are applied onto a carrier 4. The carrier 4 comprises p-contacts 41 and n-contacts 42 which each extend from a side remote from the optoelectronic structures 2 through a base body of the carrier 4 to the p-side contact points 27 and n-side contact points 28 of the optoelectronic structures 2. The optoelectronic structures are, for example, bonded to the carrier 4 by a soldering process. For this purpose, a gold-tin soldering material may, for example, be used in a thickness of at least 1.5 µm and at most 4.5 µm, for example, 3 µm.

In the method step described in conjunction with FIG. 1G, a layer of protective material 5 is applied onto the exposed outer faces of the optoelectronic structures 2 and the top face 4a of the carrier 4. The protective material completely envelops the optoelectronic structures 2. The protective material 5 is formed, for example, with a polymer, e.g., a transparent polymer. The layer thickness amounts, for example, to 0.5 µm to 2 µm. The protective material may consist of Parylene or contain Parylene.

In a further method step, FIG. 1H, a layer of a reflective material 7 is optionally applied to the exposed outer face of the protective material 5. It comprises, for example, a reflective metal coating which may contain, for example, aluminium and/or silver. Application of this layer is optional, in particular if the layer of protective material 5 is subsequently to be removed.

In the subsequent method step, FIG. 1I, each growth support 1 is removed from each optoelectronic structure 2. This proceeds, for example, by a combination of grinding and etching. During this procedure, the layer of protective material 5 and optionally the reflective material 7 protect the optoelectronic structures 2 from damage.

Figure 2A:
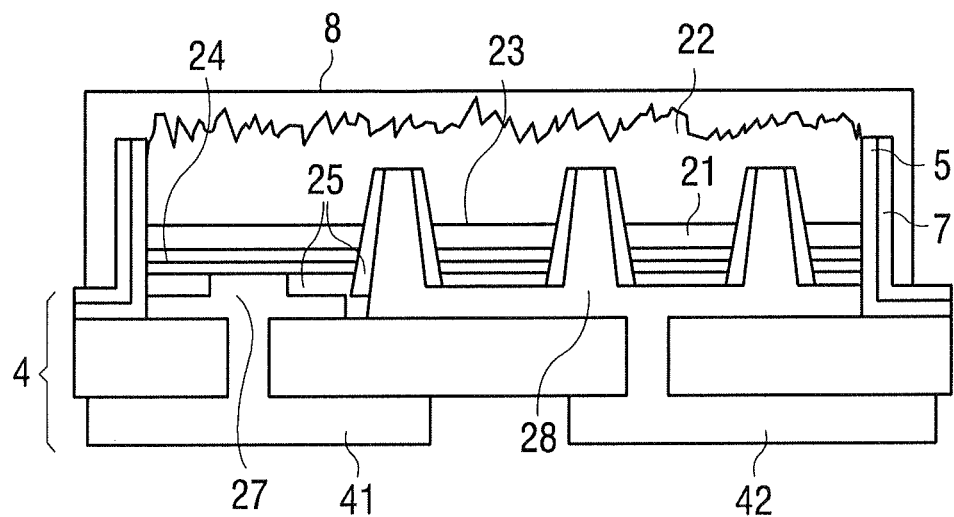
FIGS. 2A and 2B are schematic representations of an example of an optoelectronic semiconductor chip produced using our methods.

In conjunction with FIG. 2A, a schematic sectional representation is shown of an optoelectronic semiconductor chip produced by the method. In this example, the protective material 5 remains in the optoelectronic semiconductor chip. As is clear from FIG. 2A, the protective material 5 completely covers the side faces of the semiconductor layer sequence 20 right down to the carrier 4. In this way, during detachment of the growth support the protective material 5, for example, also protects a mirror layer 24, for example, from the etchant, the mirror layer in this case being of multilayer construction. The mirror layer 24 may contain silver, for example.

The reflective material 7 is applied to the outer face remote from the protective material 5. When the optoelectronic semiconductor chip is in operation, the reflective material 7 may reflect electromagnetic radiation generated, for example, in the active region 23 to the outer face, remote from the carrier 4, of the n-side 22 of the semiconductor layer sequence 20. In this case, the outer face is roughened by KOH etching, which may improve the probability of light exit.

A passivation layer 8 which may, for example, be formed with silicon dioxide is applied onto the outer face of the semiconductor layer sequence 20 and of the reflective material 7 and of the protective material 5.

Figure 2B:
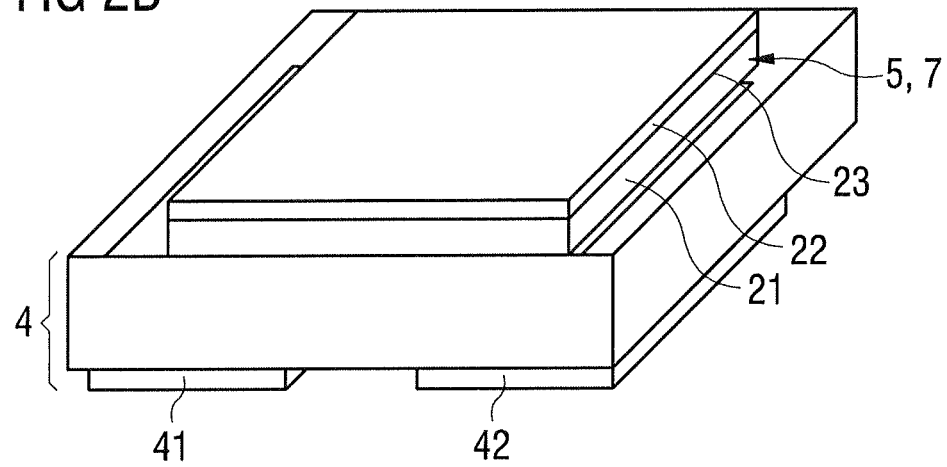

FIG. 2B shows a schematic perspective representation of this optoelectronic semiconductor chip in which the optoelectronic semiconductor chip is a surface-mountable light-emitting diode chip, for example.

The description made with reference to examples does not restrict our methods to these examples. Rather, this disclosure encompasses any novel feature and any combination of features, including in particular any combination of features in the appended claims, even if the feature or combination is not itself explicitly indicated in the claims or examples.

The invention claimed is:

1. A method of producing at least one optoelectronic semiconductor chip comprising:
   providing at least one optoelectronic structure, comprising a growth support and a semiconductor layer sequence with an active region, the semiconductor layer sequence being deposited epitaxially on the growth support,
   providing a carrier,
   applying the at least one optoelectronic structure onto the carrier with its side remote from the growth support,
   coating the at least one optoelectronic structure with a conformal layer of a protective material, the conformal layer of the protective material covering an outer face, remote from the carrier, of the growth support and side faces of the growth support and of the semiconductor layer sequence, and
   detaching the growth support from the semiconductor layer sequence of the at least one optoelectronic structure.

2. The method according to claim 1, wherein
   the protective material comprises a Parylene,
   after coating the at least one optoelectronic structure, the protective material completely covers the outer face, not covered by the carrier, of the at least one optoelectronic structure and, at least in places, covers the top face of the carrier facing the at least one optoelectronic structure, and
   the outer face of the protective material remote from the at least one optoelectronic structure is coated with a reflective material at least in places prior to detachment of the growth support.

3. The method according to claim 1, wherein, after coating the at least one optoelectronic structure, the protective material completely covers the outer face, not covered by the carrier, of the at least one optoelectronic structure and, at least in places, covers the top face of the carrier facing the at least one optoelectronic structure.

4. The method according to claim 1, wherein remaining protective material is removed after detachment of the growth support from the semiconductor layer sequence of the at least one optoelectronic structure.

5. The method according to claim 1, wherein the outer face of the protective material remote from the at least one optoelectronic structure is coated with a reflective material at least in places prior to detachment of the growth support.

6. The method according to claim 5, wherein the reflective material completely covers the exposed outer face of the protective material.

7. The method according to claim 1, wherein the growth support is detached with an etchant and the protective material is not susceptible to attack by the etchant.

8. The method according to claim 1, wherein the protective material consists of a radiation-transmissive plastics material.

9. The method according to claim 1, wherein the protective material comprises a Parylene.

10. The method according to claim 1, wherein the growth support comprises silicon and the semiconductor layer sequence is based on a nitride compound semiconductor material.

11. The method according to claim 1, wherein the at least one optoelectronic structure comprises n-side and p-side contact points on its side facing the carrier, wherein the contact points electrically conductively connect to the carrier on application of the at least one optoelectronic structure onto the carrier.

* * * * *